United States Patent
Takano et al.

[11] Patent Number: 6,165,824
[45] Date of Patent: *Dec. 26, 2000

[54] METHOD OF MANUFACTURING A SEMICONDUCTOR DEVICE

[75] Inventors: Tamae Takano; Hideto Ohnuma; Hisashi Ohtani; Setsuo Nakajima, all of Kanagawa; Shunpei Yamazaki, Tokyo, all of Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/034,041

[22] Filed: Mar. 3, 1998

[30] Foreign Application Priority Data

Mar. 3, 1997 [JP] Japan .................................... 9-065406
Apr. 26, 1997 [JP] Japan .................................... 9-123089

[51] Int. Cl.[7] ............................. H01L 21/00; H01L 21/20
[52] U.S. Cl. .......................... 438/160; 438/166; 438/175; 438/486; 438/571
[58] Field of Search .................................... 438/151, 152, 438/166, 160, 175, 486, 571, 635, 701, 720

[56] References Cited

U.S. PATENT DOCUMENTS

| | | |
|---|---|---|
| 5,424,244 | 6/1995 | Zhang et al. .............................. 437/173 |
| 5,700,333 | 12/1997 | Yamazaki et al. .. |
| 5,830,784 | 11/1998 | Zhang et al. ............................. 438/154 |
| 5,859,443 | 1/1999 | Yamazaki et al. .. |
| 5,897,347 | 4/1999 | Yamazaki et al. .. |
| 5,915,174 | 6/1999 | Yamazaki et al. .. |
| 5,932,893 | 8/1999 | Miyanga et al. .......................... 257/66 |
| 5,953,597 | 9/1999 | Kusumoto et al. .. |
| 5,961,743 | 10/1999 | Yamazaki et al. .. |
| 5,962,871 | 10/1999 | Zhang et al. ............................. 257/66 |
| 5,977,559 | 11/1999 | Zhang et al. .. |

OTHER PUBLICATIONS

Mayer, James W. "Electronic material Science: For Intergrated Circuits in Si and GaAs", Macmillan publishing, New York, 1990, pp. 176–179.

*Primary Examiner*—David Nelms
*Assistant Examiner*—Michael S. Lebentritt
*Attorney, Agent, or Firm*—Fish & Richardson, P.C.

[57] ABSTRACT

A crystal growth 301 is carried out by diffusing a metal element, and a nickel element is moved into regions 108 and 109 which has been doped with phosphorus. An axis coincident with the moving directions 302 and 303 of the nickel element at this time is made to coincide with an axis coincident with the direction of the crystal growth, and a TFT having the regions as channel forming regions is manufactured. In the path of the region where nickel moved, since high crystallinity is obtained in the moving direction, the TFT having high characteristics can be obtained by this way.

27 Claims, 10 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device using a semiconductor thin film, and particularly to a method of manufacturing a thin film transistor (TFT) using a crystalline film containing silicon.

Incidentally, the term "semiconductor device" used in the present specification includes all devices functioning by using a semiconductor, and not only a single element such as a TFT, but also an electro-optical device and an electronic device equipped therewith are also included in the category of the semiconductor device.

2. Description of the Related Art

In recent years, a technique of constituting a semiconductor circuit by forming TFTs on a glass substrate and the like, has been rapidly developed. As such a semiconductor circuit, an electro-optical device such as an active matrix type liquid crystal display device is typical.

The active matrix type liquid crystal display device is a monolithic display device in which a pixel matrix circuit and a driver circuit are provided on the same substrate. Moreover, a system-onpanel with additional built-in logic circuits of a memory circuit, a clock generating circuit and the like has also been developed.

Since such a driver circuit and a logic circuit are required to be operated at high speed, it is not suitable to use a noncrystalline silicon film (amorphous silicon film) as an active layer. Thus, under the present circumstances, a TFT using a crystalline silicon film (polysilicon film) as an active layer has become the main stream.

In general, the crystalline silicon film is obtained by forming an amorphous silicon film on a glass substrate or a quartz substrate and crystallizing the amorphous film by irradiation of a laser beam or heating.

Since the substrate is hardly heated when the crystalline silicon film is obtained by the irradiation of a laser beam, the glass substrate can be used as the substrate. However, the crystallinity of the obtained crystalline silicon film is not so good. The characteristics of a TFT obtained by using the crystalline silicon film also becomes unsatisfactory.

On the other hand, the method of heating has a problem that necessary crystallinity can not be obtained by a heat treatment at such a temperature that the glass substrate can withstand.

There is also a method in which a quartz substrate is used and a crystalline silicon film is obtained by a heat treatment at such a high temperature as 900° C. or more (a silicon film obtained by this method is especially called a high temperature polysilicon).

However, according to this method, the precipitation of grain boundaries is remarkable, and by this influence, the electrical characteristics of the obtained semiconductor device is not satisfactory.

The present inventors disclose a technique for obtaining a crystalline silicon film on the glass substrate in Japanese Patent Unexamined Publication Nos. 7-321337 and 8-78329, the disclosure thereof being incorporated herein by reference. In the technique disclosed in the publications, a catalytic element for promoting crystallization is selectively added into an amorphous silicon film, and by carrying out a heat treatment, a crystalline silicon film extending from the starting point of the added region is formed.

This technique can lower the crystallization temperature of the amorphous silicon film by the action of the catalytic element drastically by 50 to 100° C., and the time required for crystallization can also be reduced to ⅕ to ¹⁄₁₀. Since the crystallization of the silicon film progresses in a lateral direction substantially parallel to the surface of the substrate, the present inventors call this crystallized region a lateral growth region.

Since the catalytic element is not directly added in the lateral growth region, the lateral region has a feature that the amount of the catalytic element remaining in the film is small compared with the case directly added. For example, although a region in which the catalytic element is directly added, includes the catalytic element in the order of $10^{19}$, the lateral growth region includes the catalytic element in the order of $10^{18}$ which is smaller than the former value by one figure.

As the above-mentioned catalytic element, a metal element such as nickel, cobalt and tin is used. Since such a metal element forms a deep level in a silicon film to capture a carrier, there is a fear that the metal element has a bad influence to the electrical characteristics and reliability of a TFT. This problem is not exceptional even for the above-mentioned lateral growth region.

SUMMARY OF THE INVENTION

An object of the present invention is to provide a technique to remove the influence of a metal element when a semiconductor device is manufactured by using a crystalline silicon film obtained by using the metal element.

In order to achieve the object, according to a first aspect of the present invention, a method of manufacturing a semiconductor device comprises the steps of: introducing a metal element for promoting crystallization of silicon into a partial region of an amorphous silicon film; causing crystal growth from the partial region in a direction substantially parallel to a surface of the amorphous silicon film by a heat treatment to obtain a silicon film in which at least a partial region is crystallized; doping a part of the silicon film with phosphorus; and moving the metal element by a heat treatment into a region which has been doped with the phosphorus, wherein a thin film transistor having a channel made of the region where the crystal growth has been carried out and the metal element has moved into the region which has been doped with the phosphorus, is manufactured, and wherein in the region of the channel, an axis coincident with a direction of crystal growth is substantially made to coincide with an axis coincident with a direction of movement of the metal element into the region doped with the phosphorus.

In the above structure, as a method of selectively introducing the metal element, there is enumerated a method in which a nickel element is selectively brought into contact with the surface of the amorphous silicon film and is held by a plasma treatment, a CVD method, a sputtering method or a method using a solution after providing a mask. There is also enumerated a method of selectively implanting an ion of the metal element using a mask.

The step of causing crystal growth from the partial region in the direction substantially parallel to the surface of the film by the heat treatment to obtain the silicon film in which at least the partial region is crystallized, means that as shown in FIG. 3 in which the state of crystal growth is schematically shown, the crystal growth is made in a direction 301 parallel to the surface of the silicon film from a region 104 where the metal element has been introduced.

In this case, crystal growth is not necessarily made in all surfaces of the film.

As the doping method of phosphorus, although a plasma doping method and an ion implantation method in which a phosphorus ion is accelerated and implanted, are general, a diffusion method or the like may be used.

The step of moving the metal element into the region doped with phosphorus means that as schematically shown in FIG. 3B, the metal element, which was once diffused at the crystal growth (the direction of the diffusion is substantially coincident with the direction of crystal growth as indicated by 301), is made to move by a heat treatment into regions 108 and 109 doped with phosphorus.

Especially, the feature of the present invention mentioned above is that in the region which becomes the channel, an axial direction (one-dimensional extending direction) coincident with the direction 301 of the crystal growth in FIG. 3 is substantially made to coincide with an axial direction (one-dimensional extending direction) coincident with the direction 302, 303 of movement of the metal element carried out after crystallization.

In the case where the above-mentioned two axial directions are coincident with the moving direction of a carrier, the possibility of being scattered and trapped at the movement of the carrier can be remarkably lessened, so that a device having high electrical characteristics can be obtained. This is caused by the fact that when the metal element moves, the crystallinity in the moving direction is dramatically improved in the path of the movement.

According to another aspect of the present invention, a method of manufacturing a semiconductor device using a silicon film obtained by using a metal element for promoting crystallization of silicon, comprises the steps of: causing crystal growth by moving a selectively introduced metal element; and removing the metal element by moving the metal element; wherein a moving direction of a carrier in a channel is set in a direction in which an axis coincident with a direction of movement of the metal element at crystallization is substantially coincident with an axis coincident with a direction of movement of the metal element at the removable of the metal element.

In the present invention, it is extremely preferable to use nickel as the metal element.

One kind or plural kinds of metal element selected from the group consisting of Fe, Co, Ni, Ru, Rh, Pd, Os, Ir, Pt, Cu, and Au may be used as the metal element for promoting crystallization of silicon.

Other elements that have a gettering effect may be used. For example, nitrogen, arsenic, antimony, and bismuth may be used.

According to a still another aspect of the present invention, a method of manufacturing a semiconductor device comprises the steps of:

selectively forming an insulating film on an amorphous film comprising silicon; selectively holding or adding a catalytic element for promoting crystallization of silicon to the amorphous film by using the insulating film as a mask; transforming at least a part of the amorphous film into a crystalline film by carrying out a heat treatment; selectively holding or adding an element selected from group 15 elements of the Periodic Table in the crystalline film by using the insulating film as a mask as it is; and carrying out a heat treatment so that a region where the element selected from the group 15 has been held or added, is made to getter the catalytic element.

According to a still another aspect of the present invention, a method of manufacturing a semiconductor device comprises the steps of: selectively forming an insulating film on an amorphous film comprising silicon; selectively holding or adding a catalytic element for promoting crystallization of silicon to the amorphous film by using the insulating film as a mask; transforming at least a part of the amorphous film into a crystalline film by a heat treatment; selectively holding or adding an element selected from the group 15 elements in the crystalline film by using the insulating film as a mask as it is; and carrying out a heat treatment so that a region where the element selected from the group 15 elements has been held or added, is made to getter the catalytic element, wherein the region where the catalytic element is held or added is the same as the region where the element selected from the group 15 is held or added.

The basic object of the present invention is to remove the catalytic element, which was used for crystallization of the amorphous film comprising silicon, from the crystalline film, and the gettering effect of the element selected from group 15 elements is used as the means for removing the catalytic element.

As the catalytic element, Ni (nickel), Co (cobalt), Fe (iron), Pd (palladium), Pt (platinum), Cu (copper), and Au (gold) are typical. However, other metals or semimetals may be used as the catalyst.

As the element in group 15 elements for gettering the catalytic element, N (nitrogen), P (phosphorus), As (arsenic), Sb (antimony), and Bi (bismuth) are enumerated. Especially, phosphorus has a remarkable function and effect.

As a typical example, when nickel is used as the catalytic element, and phosphorus is used as the gettering element, by a heat treatment at about 600° C., phosphorus and nickel show a stable coupling state. At this time, a coupling state such as $Ni_3P$, $Ni_5P_2$, $Ni_3P_2$, $Ni_2P_3$, $NiP_2$, $NiP_3$ can be formed.

As described above, when nickel is used as the catalytic element for promoting crystallization of an amorphous film comprising silicon, by the action of phosphorus, nickel can be gettered. By using this effect, it is possible to remove the catalytic element or lower its concentration in the crystalline film.

The most remarkable features in the above-mentioned invention are that:

1. a crystalline film called a lateral growth region is formed by selectively providing an insulating film (mask) to an amorphous film and by holding or adding a catalytic element, and
2. a gettering element is held or added by positively using the mask as it is, to getter the catalytic element remaining in the lateral growth region.

That is, when the amorphous film is crystallized, by using the technique disclosed in Japanese Patent Unexamined Publication No. 8-78329, the insulating film remaining on the crystalline film after crystallization is again used as a mask for selectively holding or adding the gettering element. The disclosure of said publication is incorporated herein by reference. Thus, the region where the catalytic element is held or added is the same as the region where the gettering is held or added.

DETAILED DESCRIPTION OF THE PREFERRED INVENTION

Figure 1A:
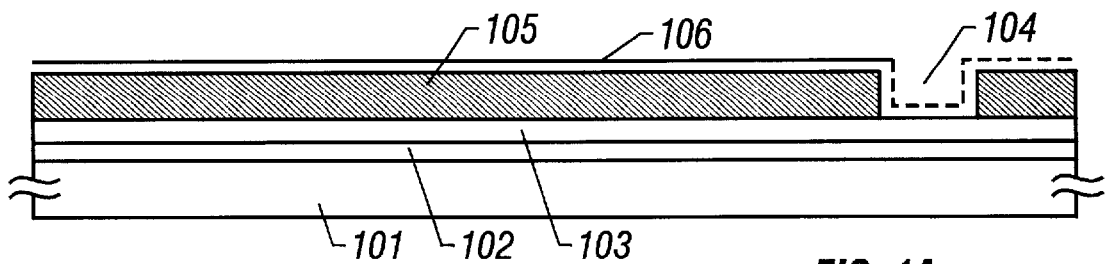
FIGS. 1A to 1E are views showing manufacturing steps of a thin film transistor.

In FIG. 5, an amorphous film comprising silicon (for example, amorphous silicon film) 503 is formed on a substrate having an insulating surface, and an insulating film 504 is provided thereon. Since this insulating film 504 is used as a mask in a subsequent step of selectively adding or holding a catalytic element, the insulating film includes a plurality of opening portions 505 at predetermined positions.

Next, a layer 506 containing a catalytic element is formed, and by carrying out a heat treatment for crystallization, a lateral growth region 508 made of a crystalline film is obtained. At this time, an added region 507 of the catalytic element also becomes a crystalline film.

After the crystallization is ended, the mask insulating film 504, which was used in the step of adding the catalytic element, is again used as a mask as it is, and a step of adding an element selected from group 15 elements is carried out. Thus, the added region 507 of the catalytic element is the same as the added region of the element selected from group 15.

By carrying out a heat treatment, the catalytic element remaining in the lateral growth region 508 is moved, and is gettered in the region 507 where the element selected from group 15 elements has been added. In this way, the catalytic element remaining in the lateral growth region 508 is removed or its concentration is lowered.

[Embodiment 1]

FIGS. 1A–1E and 2A–2D show manufacturing steps of this embodiment. In this embodiment, steps of manufacturing an N-channel TFT will be described.

First, as shown in FIG. 1A, a silicon oxide film 102 with a thickness of 400 nm as an under film is formed on a glass substrate 101 by a plasma CVD method. As the under film, a silicon nitride oxide film formed by a plasma CVD method or a silicon oxide film formed by a low pressure thermal CVD method may be used.

Other than the glass substrate, a quartz substrate may be used. A semiconductor substrate with a thermal oxidation film or a silicon oxide film formed on the surface thereof may also be used.

In this embodiment, an insulation substrate or a substrate having an insulating film will be referred to as a substrate having an insulating surface. Thus, the glass substrate 101 having the silicon oxide film 102 is also a substrate having an insulating surface. Of course, even if the silicon oxide film is not formed, the glass substrate is a substrate having an insulating surface.

After the under film 102 is formed, an amorphous silicon film 103 with a thickness of 50 nm is formed by a low pressure thermal CVD method. As a method other than the low pressure thermal CVD method, a plasma CVD method may be used. However, the film formed by the low pressure thermal CVD method has a film quality denser than that formed by the plasma CVD method, so that better result can be obtained in the subsequent crystallization.

After the amorphous silicon film 103 is formed, a silicon oxide film is formed by the plasma CVD method. By patterning this film, a mask 105 is formed. This mask is formed such that an opening portion indicated by 104 is formed in a part of the mask. This mask 104 is made to have a slit shape having a longitudinal shape from this side of the paper to the depth side.

The width of this opening portion is required to have at least about 10 $\mu$m. This is because when a nickel element is subsequently introduced by using a solution, if the width of the opening portion is smaller than the above value, the solution does not sufficiently come in contact with the bottom portion of the opening portion.

In this way, the state shown in FIG. 1A is obtained. Next, a solution of nickel acetate is applied to obtain the state in which a nickel element is brought into contact with the surface and is held. In this state, the nickel element is brought into contact with the surface of the amorphous silicon film 103 in the opening 104 (FIG. 1A).

Figure 1B:
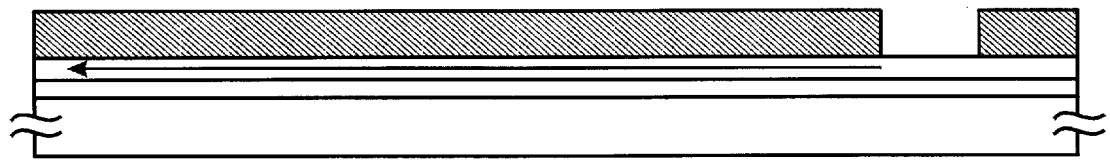

Next, a heat treatment at a temperature of 580° C. for 8 hours is carried out in a nitrogen atmosphere. In this step, as shown in FIG. 1B, crystal growth progresses from the opening portion 104 in the direction parallel to the substrate. This crystal growth will be referred to as lateral growth.

This crystal growth progresses substantially uniformly in the direction perpendicular to the direction of extension of the opening portion 104.

It is preferable to carry out the heat treatment for crystallization at a temperature within a range of 500° to 620° C. This is because, if a temperature is lower than this temperature range, the growth speed of the lateral growth is too slow to be practical, and if a temperature is higher than the temperature range, the lateral growth is hindered by generation of natural nuclei (crystal growth independent of the action of the nickel element).

Figure 3A:
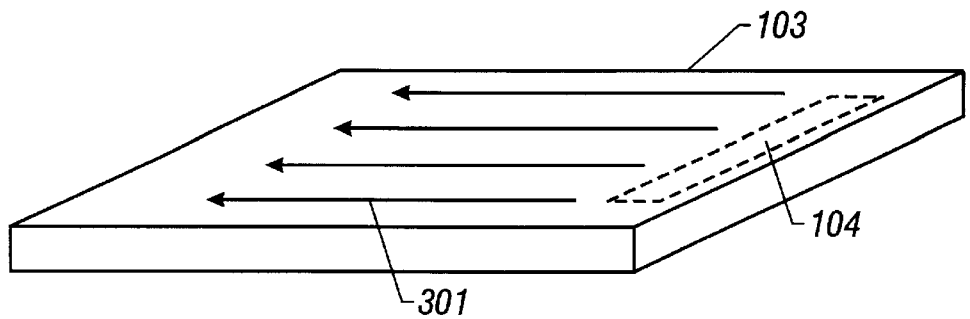
FIGS. 3A and 3B are schematic views showing the state of crystal growth.
Figure 3B:
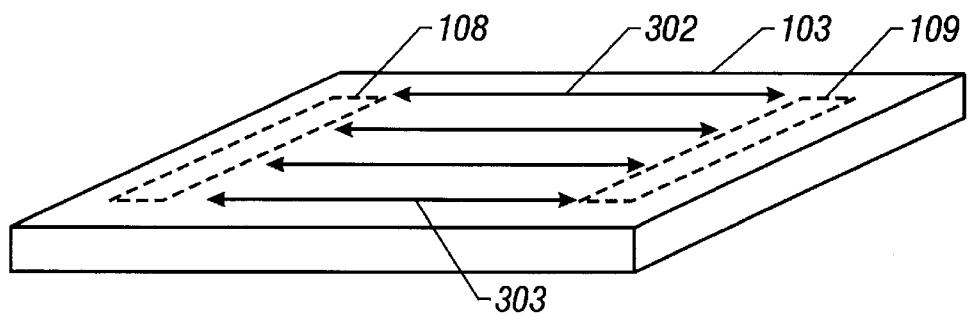

FIG. 3A schematically shows the state of crystallization in the step shown in FIG. 1B. The mask 105 of the silicon oxide film, the under film 102, and the substrate 101 are not shown in this drawing.

As shown in FIG. 3A, the lateral growth progresses parallel to the substrate and the direction of crystal growth is uniform.

When the nickel added region 104 is made a circular shape or a rectangular shape, crystal growth radially progresses.

Although FIG. 3A shows that crystal growth as shown by arrows 301 progresses only on the surface of the silicon film 103, the shape of the crystal growth is almost the same in the thickness direction of the silicon film.

With the crystal growth as shown by the arrows 301, diffusion (movement) of the nickel element as shown by the arrows 301 is also carried out. This is supported by the fact that when a plurality of samples in which a heat treatment is stopped at different stages of the state of crystal growth are formed, and when the tip portion of the crystal growth in the samples are observed, the nickel element with a high concentration is observed.

Figure 1C:
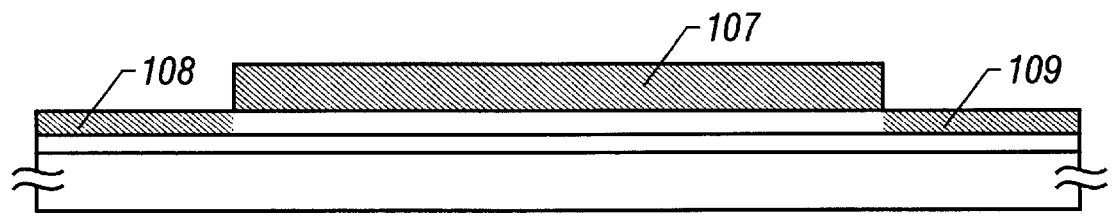
Figure 1D:
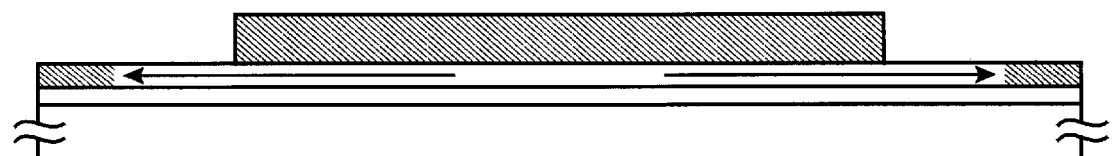

After the crystallization is ended, the silicon oxide film 105 is next processed to obtain a pattern designated by 107 in FIG. 1C.

In this state, P (phosphorus) ions are implanted by a plasma doping method. This doping may be carried out by an ion doping method in which an ion having been subjected to mass separation is accelerated and implanted.

By carrying out this doping, doping of phosphorus is carried out in regions designated by 108 and 109 in FIG. 1C.

Next, a heat treatment at 600° C. for two hours is carried out in a nitrogen atmosphere. In this step, the nickel element contained in the film is gettered by phosphorus added into the regions 108 and 109.

The nickel element moves extensively for a considerable distance in the silicon film in the heat treatment at about 600° C. It is supposed that this moving distance is 100 $\mu$m or more.

At this time, the nickel element having reached the regions 108 and 109 is combined with phosphorus to become stable nickel phosphide and is fixed.

The nickel phosphide has a variety of coupling states such as $NiP$, $NiP_2$, $Ni_2P$, and the combined state becomes very stable. Moreover, the combined body is hardly moved by heating at about 600° C.

Thus, by carrying out the heat treatment at 600° C. for two hours, the nickel element is concentrated in the regions 108 and 109.

The step of this heat treatment may be carried out at a temperature within the range of 500° to 700° C. If the temperature is lower than this temperature range, the degree of movement of the nickel element is lessened so that the effect may not be obtained sufficiently. If the heat treatment is carried out at a temperature higher than this temperature range, the movement of nickel phosphide becomes active so that there is a danger that the gettered elements are again diffused back to the crystallized film.

Next, by using the remaining mask 107, the regions 108 and 109 are removed.

Figure 1E:
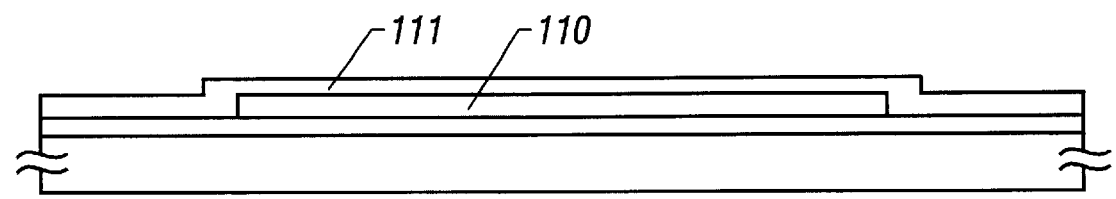

Further, a resist mask is again disposed, and the silicon film is patterned to form an active regions. In this way, a pattern 110 made of the silicon film as shown in FIG. 1E is obtained. The pattern 110 of the silicon film is constituted by using the region where the lateral growth and the gettering were carried out. The pattern 110 of the silicon film subsequently constitutes an active layer of a TFT.

After the pattern 110 which becomes an active layer is formed, a silicon oxide film 111 with a thickness of 90 nm, which becomes a gate insulating film, is formed by a plasma CVD method.

Figure 2A:
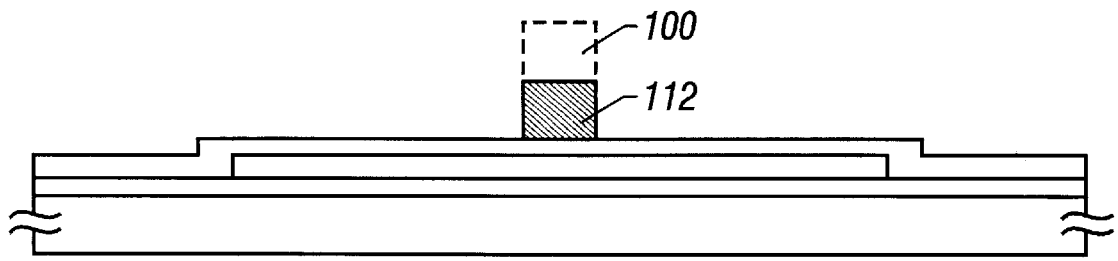
FIGS. 2A to 2D are views showing manufacturing steps of a thin film transistor.

In this way, the state as shown in FIG. 1E is obtained. Next, an aluminum film with a thickness of 40 nm is formed by a sputtering method. Then, by using a resist mask 100, as shown in FIG. 2A, a pattern 112 made of the aluminum film is formed by a sputtering method. This aluminum pattern 112 becomes an original pattern for subsequently forming a gate electrode (and a wiring line extended therefrom) (FIG. 2A).

It is preferable to make the aluminum pattern contain a trace element of scandium, silicon, titanium or the like. The addition of such a small amount of element has an effect to suppress the formation of spike-like or needle-like protrusions called hillocks or whiskers which may be generated in a subsequent step due to abnormal growth of aluminum.

Next, in the state in which the resist mask is made to remain, an anodic oxidation film 113 with a thickness of 400 nm is formed. The growth distance of this anodic oxidation film 113 determines the size of a subsequent low concentration impurity region.

This step is carried out by using a solution containing oxalic acid of 3% (vol %) as an electrolytic solution, the aluminum pattern 112 as an anode, and platinum as a cathode.

Figure 2B:
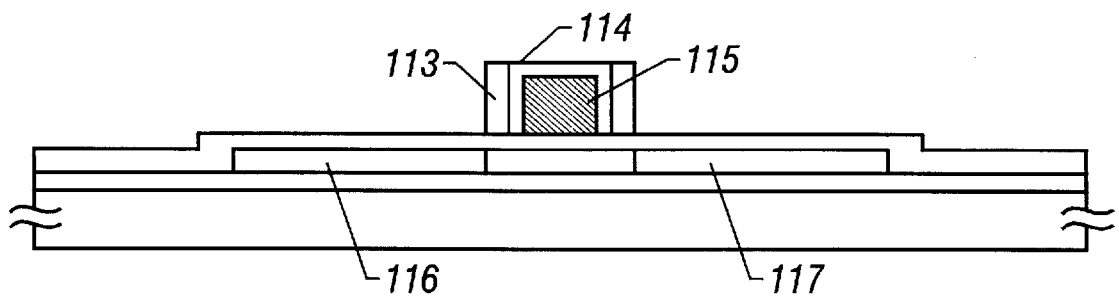

In this step, since the resist mask exists, the anodic oxidation progresses toward a side direction of the aluminum pattern as designated by 113 (FIG. 2B). This anodic oxidation film has porous film quality.

Next, the resist mask 100 is removed, and anodic oxidation is again carried out. Here, an ethylene glycol solution containing tartaric acid of 3% (vol %) neutralized by aqueous ammonia is used as an electrolytic solution.

In this step, since the electrolytic solution penetrates into the porous anodic oxidation film 113, an anodic oxidation film designated by 114 is formed. This anodic oxidation film 114 has dense film quality.

Then the region 115, which has not been oxidized and remains as aluminum, becomes a gate electrode. A not-shown gate wiring line extends from this gate electrode.

In this way, the state shown in FIG. 2B is obtained. Next, in this state, doping of phosphorus ions is carried out by a plasma doping method.

Next, the porous anodic oxidation film 113 is removed. Doping of phosphorus is again carried out by the plasma doping method. This step is carried out under the condition of a low dosage as compared with the doping carried out in the step shown in FIG. 2B.

Figure 2C:
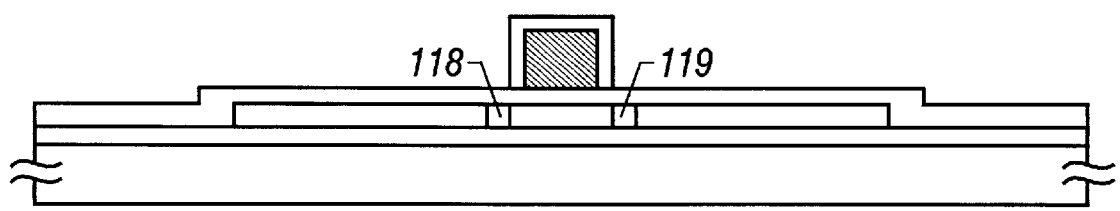

In this step, doping of phosphorus at a low dosage is carried out in the regions 118 and 119, so that the low concentration impurity regions 118 and 119 are formed (FIG. 2C).

After the doping is ended, irradiation of a KrF excimer laser (wavelength 248 nm) is carried out to anneal the damage of crystal structure generated at the doping and to activate the dopant (phosphorus in this case).

In this way, a source region 116, a drain region 117, and the low concentration impurity regions 118 and 119 are formed in a self-aligning manner. A region of an active layer just below the gate electrode 115 where doping was not carried out, becomes a channel formation region.

The low concentration impurity region 119 at the drain side is a region generally referred to as an LDD (Lightly Doped Drain).

After the irradiation of laser light, a heat treatment at 550° C. for 30 minutes is carried out. This makes it possible to concentrate the nickel element remaining in the active layer into the source and drain regions. At this time, since nickel moves into the region where phosphorus of a higher concentration exists, it does not concentrate in the low concentration impurity region.

Figure 4:
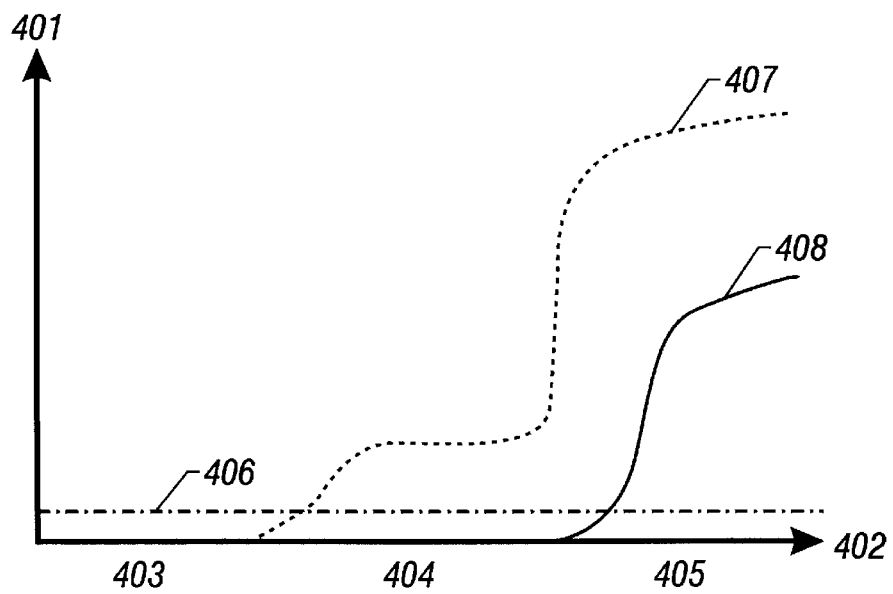
FIG. 4 is a view showing the relation between a phosphorus concentration and a nickel concentration.

FIG. 4 shows this state. In FIG. 4, the vertical axis indicates a relative concentration 401, and the horizontal axis indicates a position 402. In the horizontal axis, 403 designates a channel region, 404 designates a low concentration impurity region, and 405 designates a drain region. Moreover, 406 designates an initial distribution of remaining nickel concentration, 407 designates a distribution of phosphorus concentration, and 408 designates a distribution of nickel after heat treatment. As shown in FIG. 4, at the stage when the doping is ended, the remaining nickel is distributed uniformly in the whole.

However, by carrying out the heat treatment, the distribution of nickel slants to the drain region side. At this time, nickel is concentrated in the drain region where the concentration of phosphorus is higher. The same is true with the side of the source region.

By concentrating the nickel element into the source and drain regions in this way, the bad influence due to the existence of the nickel element to the operation of a TFT can be reduced. In the operation of a TFT, when the metal element exists in the channel region and the low concentration impurity region, the influence of the metal element is the most serious. In the source and drain regions, unless the state in which the metal element moves in the regions, is not established, that is, if the state in which the metal element is fixed, is established, the regions do not have a bad influence to the operation of a TFT.

Figure 2D:
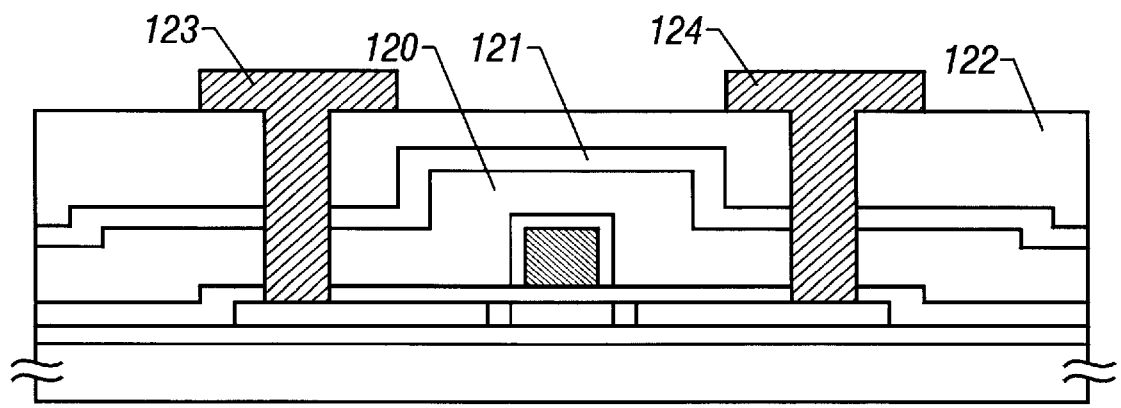

Next, as shown in FIG. 2D, a silicon oxide film 120 with a thickness of 600 nm as an interlayer insulating film is formed by the plasma CVD method. Further, a silicon nitride film 121 with a thickness of 150 nm is formed by the plasma CVD method. Moreover, a film 122 made of acrylic resin is formed. This film is formed under such a condition that the minimum thickness becomes 500 nm. This film is formed by applying a soluble acrylic resin with the use of a spinner and by heating and sintering the resin.

A material such as polyimide, polyamide, polyimide amide, and epoxy may be used other than acryl.

Next, contact holes are formed, and a source electrode 123 and a drain electrode 124 are formed.

These electrodes are constituted by a laminated film (three-layered film) of a titanium film with a thickness of 100 nm, an aluminum film with a thickness of 400 nm, and a titanium film with a thickness of 100 nm. The formation of the respective films is carried out by using a sputtering method.

Finally, a heat treatment at 350° C. for one hour is carried out in a hydrogen atmosphere of 100%. In this way, the N-channel TFT is completed.

[Embodiment 2]

An example of manufacturing steps of forming an active layer made of a crystalline film by using the present invention will be described with reference to FIGS. 5A to 5F. In this example, nickel is used as a catalytic element, and phosphorus is used as an element for gettering.

First, a glass substrate 501 is prepared, and an under film 502 made of a silicon oxide film and having a thickness of 200 nm is formed thereon. Instead of the glass substrate, a quartz substrate, a silicon substrate, a ceramic substrate, and the like may be used.

Next, an amorphous silicon film 503 with a thickness of 10 to 75 nm (preferably 15 to 45 nm) is formed by using a plasma CVD method or a low pressure CVD method. Other than the amorphous silicon film, an amorphous semiconductor film comprising silicon, such as $Si_XGe_{1-X}$ (0<X<1) may be used.

Next, a step of crystallizing the amorphous silicon film 503 is carried out. The detailed conditions are disclosed in Japanese Patent Unexamined Publication No. 8-78329, the disclosure of which is incorporated herein by reference.

Figure 5A:
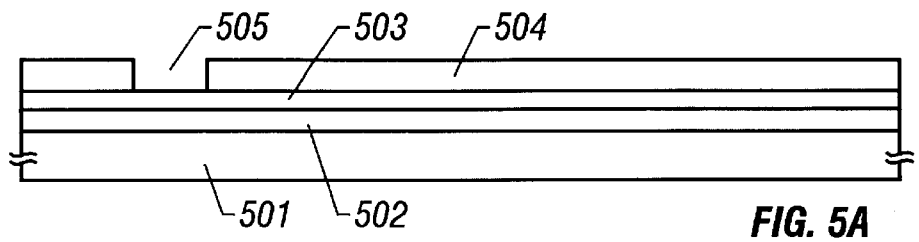
FIGS. 5A to 5F are views showing forming steps of a crystalline film.

First, a mask insulating film 504 made of a silicon oxide film and having a thickness of 50 to 150 nm is formed on the amorphous silicon film 503. Then the mask insulating film 504 is patterned, and an opening portion 505 is provided at a region into which nickel is subsequently added (FIG. 5A).

Next, by irradiation of UV light in an oxygen atmosphere, a very thin silicon oxide film (not shown) is formed on the surface of the amorphous film exposed in the bottom portion of the opening portion 505. This step has an effect to improve wettability at the next application of a solution. Then a solution of nickel acetate containing nickel of 100 ppm in weight is dropped, and a thin nickel containing layer 506 is formed by a spin coating method (FIG. 5B).

Figure 5B:
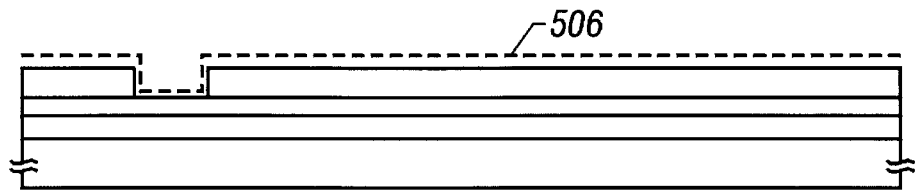
Figure 5C:
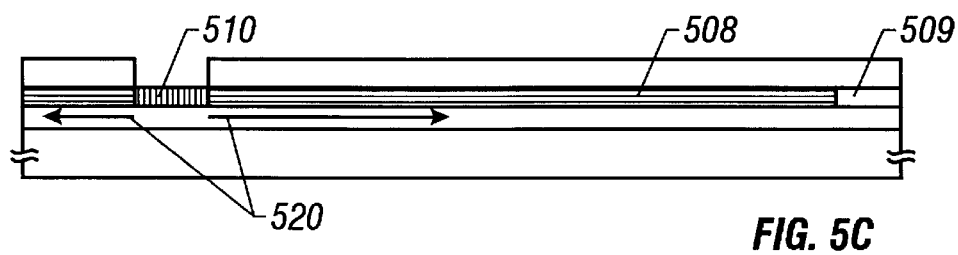

After the state as shown in FIG. 5B is obtained, a heat treatment at a temperature of 500° to 700° C. (typically 550 to 650° C.) for 4 to 8 hours is carried out in a nitrogen, oxygen or hydrogen atmosphere to crystallize the amorphous silicon film 503. Reference numeral 520 designates the growth direction of crystal (FIG. 5C).

At this time, the silicon film after crystallization is classified into three regions of (1) an added region 507 of nickel (crystalline film), (2) a lateral growth region 508 (crystalline film), and (3) a region 509 (amorphous film) which the lateral growth did not reach. The present invention uses (2) lateral growth region as an active layer.

In this way, the lateral growth region 508 made of a crystalline silicon film is obtained. It has been confirmed by a SIMS (Secondary Ion Mass Spectrometry) that nickel of a concentration of about $5 \times 10^{18}$ atoms/cm$^3$ remains in the lateral growth region immediately after the crystallization. Incidentally, the concentration of nickel in this specification is defined as the minimum value of measurement values by the SIMS analysis.

Next, P ions for a gettering step are added by again using the mask insulating film 504 used in the nickel addition step as it is. The addition of P ions may be carried out by an ion implantation method or a plasma doping method.

The former method is different from the latter method in that in the former method, only P ions are mass-separated and are added, while in the latter method, mass-separation is not carried out but a compound ion containing a P ion is also added. In this embodiment, the plasma doping method, which is advantageous in the cost per performance, is used. In this embodiment, since $PH_3$ (phosphine) is used as a gas for plasma doping, an element such as to hinder the gettering effect is not mixed.

Figure 5D:
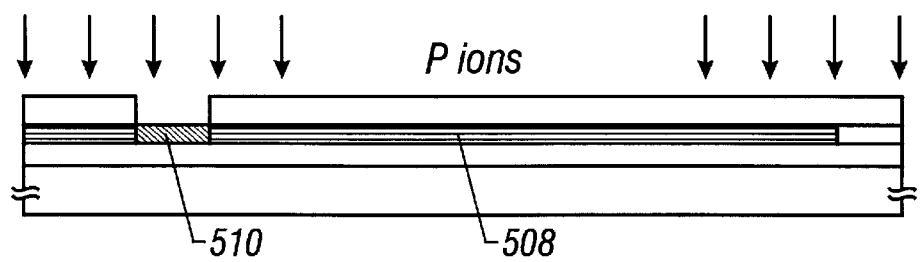

In the doping step in this embodiment, an acceleration voltage is 5 to 25 kV, and a dosage is $1 \times 10^{13}$ to $8 \times 10^{15}$ atoms/cm$^2$. By such setting, P ions with a concentration of $5 \times 10^{19}$ to $2 \times 10^{21}$ atoms/cm$^3$ are added into a P ion added region (hereinafter referred to as phosphorus added region) 510 (FIG. 5D).

In the structure of this embodiment, the phosphorus added region is the same as the nickel added region. That is, the above-mentioned concentration is set because it is desirable to set the P ion concentration higher by about one figure than the concentration (about $1 \times 10^{19}$ to $5 \times 10^{19}$ atoms/cm$^3$) of nickel contained in the phosphorus added region 510.

After the addition step of the P ions is ended, a heat treatment at a temperature of 500° to 700° C. (typically 600° C.) for 2 to 4 hours is carried out in a nitrogen atmosphere, so that nickel remaining in the lateral growth region 508 is moved into the phosphorus added region 510. Reference numeral 521 designates the direction of movement of Ni. In this way, the lateral growth region 511 where the concentration of nickel has been lowered by the P ions is obtained (FIG. 5E).

In the way described above, nickel which has remained in the lateral growth region 508 is gettered in the phosphorus added region 510 (which may be also called the nickel added region), and is removed from the lateral growth region 508 or its concentration is lowered. According to the SIMS analysis conducted by the present inventors, it has been confirmed that the concentration of nickel contained in the lateral growth region 511 is lowered to $1 \times 10^{18}$ atoms/cm$^3$ or less (preferably $5 \times 10^{17}$ atoms/cm$^3$ or less).

Figure 6:
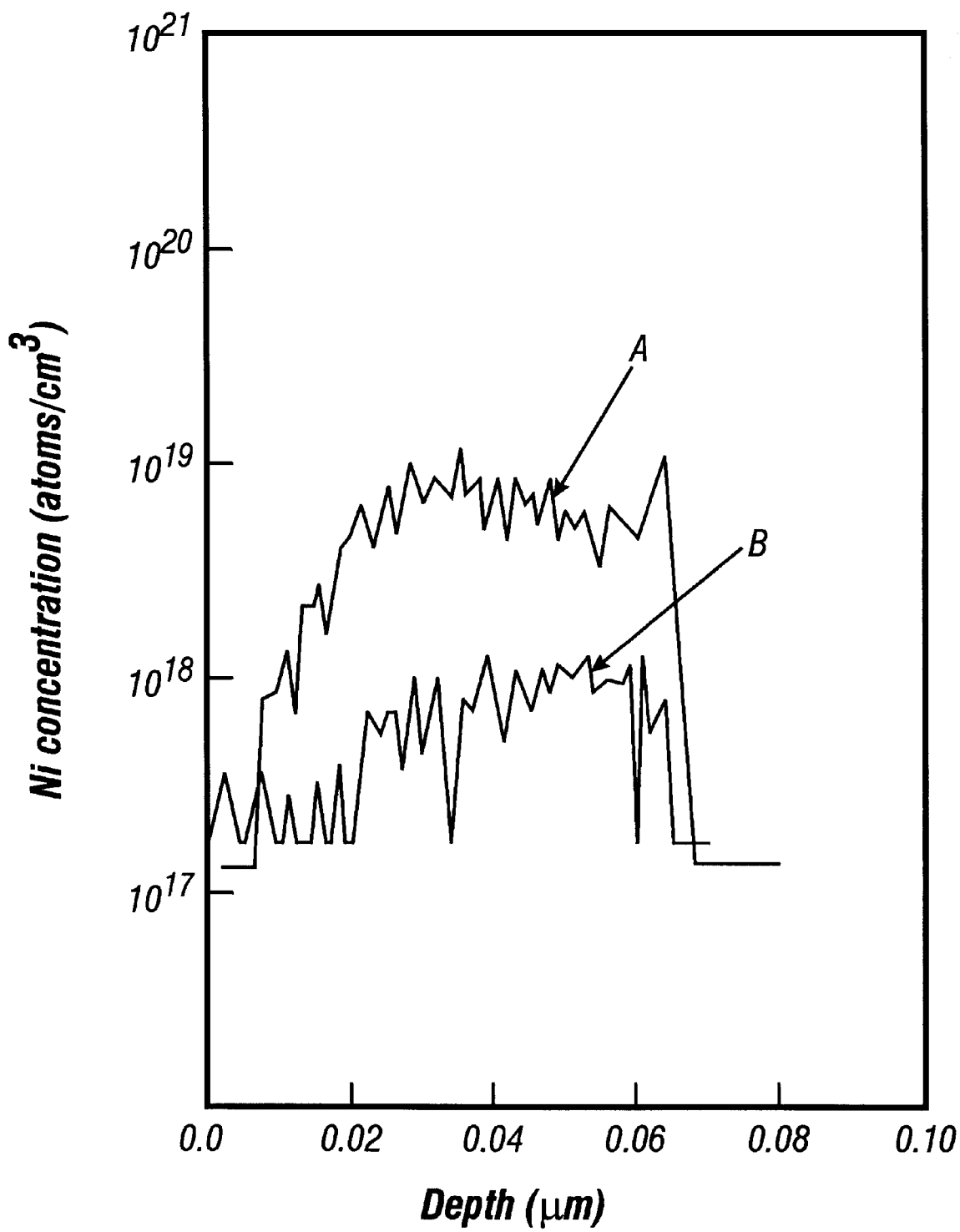
FIG. 6 is a view showing a nickel concentration in a crystalline film.

The data shown in FIG. 6 is a typical example of concentration profile of nickel in the depth direction obtained by the SIMS analysis. The horizontal axis indicates a depth ($\mu$m) and the vertical axis indicates a concentration of nickel (atoms/cm$^3$). A crystalline silicon film used as a sample has a thickness of 50 nm.

Figure 5E:
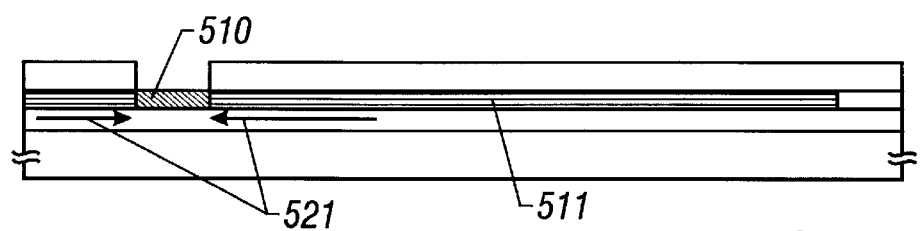

In FIG. 6, the data indicated by A is based on the result of measurement of the region where the P ions were added, which corresponds to the region designated by 510 in FIG. 5E. Since this region functions as a gettering site, nickel with a concentration of $5\times10^{18}$ atoms/cm$^3$ or more is detected.

The data indicated by B is based on the result of measurement of the lateral growth region, which corresponds to the region designated by 511 in FIG. 5E. Although nickel with a concentration of $5\times10^{18}$ atoms/cm$^3$ remained in the lateral growth region at the stage of a preliminary experiment, it is understood that the concentration is lowered to $5\times10^{17}$ atoms/cm$^3$ or less by the gettering step.

Although the graph sometimes shows flat portions in the depth of 0.0 to 0.02 $\mu$m, this means the lower limit of detection, and it is expected that the concentration is actually lowered to $1\times10^{17}$ atoms/cm$^3$ or less.

After the gettering step as described above is ended, the mask insulating film 504 is removed, and the silicon film in which the crystalline film 504 and the amorphous film are mixed, is patterned. At this time, although it is desirable to completely remove the phosphorus added region 510, at least a portion which becomes a channel formation region is made to be constituted by the lateral growth region 511.

The portions which subsequently become source/drain regions can be made to sufficiently function by adding P ions having a concentration exceeding the concentration of nickel. Thus, in some cases, it does not matter even if the phosphorus added region 110 is contained in the source/drain regions.

Figure 5F:
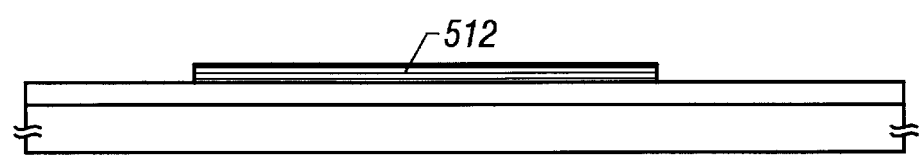

In the manner described above, the active layer (island-shaped semiconductor layer) 512 constituted by only the lateral growth region 511 is completed. By adopting the structure shown in this embodiment, it is possible to obtain a crystalline silicon film in which nickel for promoting crystallization is greatly lowered (FIG. 5F).

Moreover, since the mask insulating film used int the addition of nickel is again used in the addition of the P ions, it is not necessary to newly provide another mask for the step of adding the P ions. Thus, the manufacturing process can be simplified, the manufacturing yield and throughput are improved, and the economically superior effect can be obtained.

[Embodiment 3]

This embodiment is an example in which an ion implantation method is used as a method of introducing a nickel element in the step shown in embodiment 1 or embodiment 2.

When the nickel element is introduced by using the ion implantation method, it is possible to accurately control the amount of introduction. Further, since the size of the opening portion of the mask (for example, the portion 104 in FIG. 1) can be lessened to the order of $\mu$m, it is possible to deal with the case where the circuit is made minute.

[Embodiment 4]

In this embodiment, the structure in which laser annealing is carried out before carrying out the heat treatment for gettering in embodiment 1 or embodiment 2, will be described.

By the laser annealing, it is possible to instantaneously increase the temperature to such a degree that silicon can be melted. Especially, in the case of a pulse laser, since the silicon film causes abrupt phase change in a short time of 1 $\mu$s or less, the film becomes a thermodynamically unstable state. In this state, nickel is apt to move so that it becomes possible to easily carry out the gettering.

By using this, if the structure that furnace annealing is carried out after the irradiation of laser beam, is adopted, nickel can be effectively gettered so that the structure is effective. However, since the annealing is carried out through an insulating film as a mask, it is necessary to experimentally determine the optimum processing conditions (wavelength of laser light, intensity of energy, etc.) in advance.

An excimer laser using KrF, ArF, XeCl or the like as an excitation gas, a $CO_2$ laser, a YAG laser and the like may be used to radiate the laser light.

[Embodiment 5]

In embodiment 1 or embodiment 2, examples of carrying out furnace annealing for the heat treatment for gettering have been described. In this embodiment, an example of using lamp annealing will be described.

As a heat treatment by the lamp annealing, RTA (Rapid Thermal Annealing) is known. This is a technique to irradiate a sample with infrared rays using a halogen lamp or the like to heat a thin film.

If the RTA is used for the heat treatment in embodiment 1, a high temperature annealing process at 700 to 1,100° C. can be carried out in a short time such as several seconds to several minutes. Thus, since the higher temperature process than the furnace annealing can be carried out, the Bettering effect of the catalytic element is improved. Moreover, the processing time is also far shorter than the furnace annealing, so that the throughput is greatly improved.

Moreover, by the heat treatment at a high temperature of 700 to 1,100° C., silicon atoms existing in the vicinity of crystal boundaries of a crystalline silicon film are rearranged, so that inactivation of the crystal grain boundaries is promoted. That is, crystal defects such as dangling bonds are greatly decreased so that the possibility that carries are captured is lowered, and the crystallinity in the whole is extremely improved.

[Embodiment 6]

In embodiment 1 or embodiment 2, examples in which the ion implantation method or plasma doping method is used as means for adding the P ions, have been described. In this embodiment, an example in which a vapor phase method is used, will be described.

In this embodiment, in the state shown in FIG. 5D, the substrate is exposed to a $PH_3$ gas, and a thin film containing the P ions is deposited by a CVD method. At this time, there is obtained a state in which the above thin film is held on only the surface of the region (region designated by 507 in FIG. 5D) which becomes a gettering site. When a heat treatment is carried out in this state, gettering of nickel by the P ions can be carried out.

[Embodiment 7]

Although an example in which the vapor phase method is used, has been described in embodiment 6, an example in which a liquid phase method is used, will be described in this embodiment.

In this embodiment, in the state shown in FIG. 5D, a film of PSG (phosphosilicate glass) is formed. A spin coating method by application of a solution is used as the film formation method. In this case as well as the fourth embodiment, there is obtained a state in which the above thin film is held on only the surface of the region (region designated by 507 in FIG. 5D) which becomes a gettering site. When a heat treatment is carried out in this state, nickel is gettered by P ions contained in PSG.

[Embodiment 8]

This embodiment is an example in which a P-channel TFT is manufactured in the manufacturing steps described in embodiment 1.

In this case, a dopant in the doping step carried out in FIGS. 2B and 2C is made boron. In this case, heating after the end of doping may be omitted since the gettering effect can not be expected in the case of using boron alone. However, it is possible to use boron in combination with phosphorus in order to increase the gettering effect.

[Embodiment 9]

In this embodiment, an example of steps of manufacturing a CMOS circuit in which an N-channel TFT and a P-channel TFT are complementarily combined, will be described. In FIGS. 7A to 7E, an N-channel TFT is formed at the left side, and a P-channel TFT is formed at the right side.

Figure 7A:
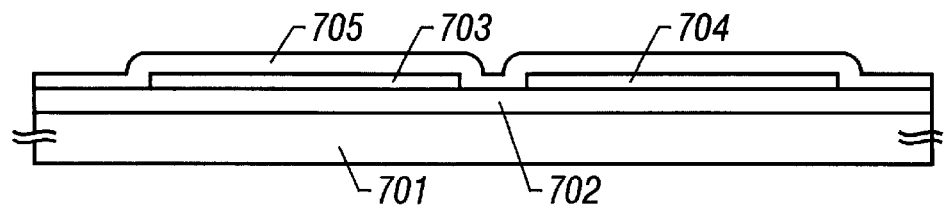
FIGS. 7A to 7E are views showing manufacturing steps of a TFT.

In FIG. 7A, 701 designates a glass substrate, 702 designates an under film, 703 designates an active layer of an N-channel TFT, and 704 designates an active layer of a P-channel TFT. The active layers 703 and 704 are formed in accordance with the manufacturing steps described in embodiment 1 or embodiment 2.

Next, a silicon oxide film with a thickness of 150 nm is formed by a plasma CVD method or a low pressure thermal CVD method to form a gate insulating film 705 (FIG. 7A).

Next, a metal film (not shown) mainly containing aluminum is formed, and an origin of a subsequent gate electrode is formed by patterning. Next, the technique developed by the present inventors et al. and disclosed in Japanese Patent Unexamined Publication No. 7-135318 is used, the disclosure thereof being incorporated by reference. By using the technique disclosed in the publication, porous anodic oxidation films 706 and 707, dense anodic oxidation films 708 and 709, and gate electrodes 710 and 711 are formed.

Figure 7B:
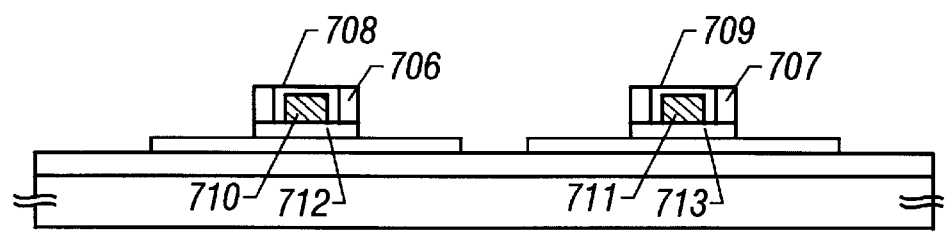

Next, the gate insulating film 705 is etched by using the gate electrodes 710 and 711, and the porous anodic oxidation films 706 and 707 as masks, to form gate insulating films 712 and 713. Thereafter, the porous anodic oxidation films 706 and 707 are removed. In this way, the state in which end portions of the gate insulating films 712 and 713 are exposed, is obtained (FIG. 7B).

Next, impurity ions for imparting N-type are added two times by an ion implantation method or a plasma doping method. In this embodiment, the first addition of impurity is carried out at a high acceleration voltage to form n⁻ region.

At this time, since the acceleration voltage is high, the impurity ions are added into not only the exposed surface of the active layer but also the region under the end portions of the exposed gate insulating film. A dosage is set so that this n⁻ region becomes a subsequent LDD region (the impurity concentration is about $1\times10^{18}$ to $1\times10^{19}$ atoms/cm$^3$).

Further, the second impurity addition is carried out at a low acceleration voltage to form an n⁺ region. At this time, since the acceleration voltage is low, the gate insulating film functions as a mask.

Since this n⁺ region becomes subsequent source/drain regions, adjustment is performed to make the sheet resistance 500 Ω or less (preferably 300 Ω or less).

Figure 7C:
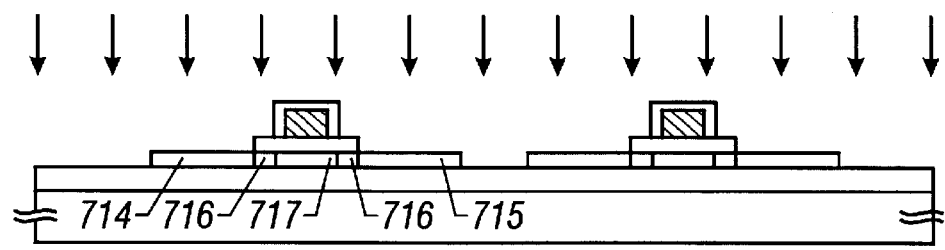

Through the above-mentioned steps, a source region 714, a drain region 715, a low concentration impurity region 716, and a channel formation region 717 of the N-channel TFT are formed. Incidentally, in this state, the active layer of the P-channel TFT is also in the same state as the active layer of the N-channel TFT (FIG. 7C).

Next, a resist mask 718 to cover the N-channel TFT is provided, and impurity ions for imparting P-type are added. This step is also divided into two steps and is carried out similarly to the above-mention ed impurity addition step. However, in this case, since the N-type must be inverted into P-type, it is necessary to add the impurity ions of a concentration higher than that in the above-mentioned step of the N-channel TFT by about two to three times.

Figure 7D:
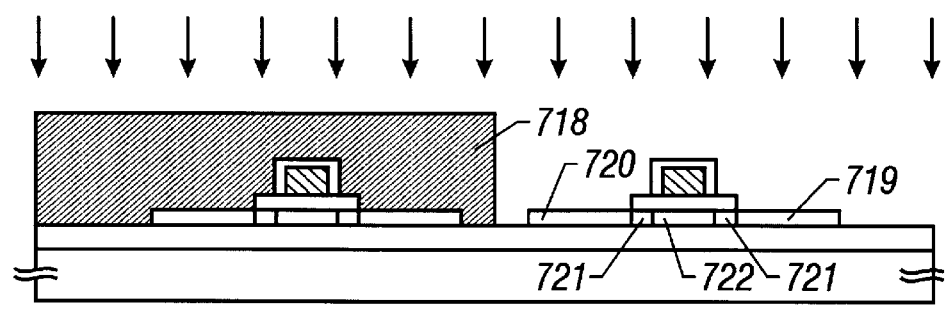

In this way, a source region 719, a drain region 720, a low concentration impurity region 721, and a channel formation region 722 of the P-channel TFT are formed (FIG. 7D).

After the active layers are completed in the manner as described above, activation of the impurity ions and recovery of damages at the addition of the ions are made by furnace annealing, laser annealing, or lamp annealing.

Next, an interlayer insulating film 723 with a thickness of 500 nm is formed. As the interlayer insulating film 723, one of or a laminated film of a silicon oxide film, a silicon nitride film, a silicon nitride oxide film, and an organic resin film may be used.

Figure 7E:
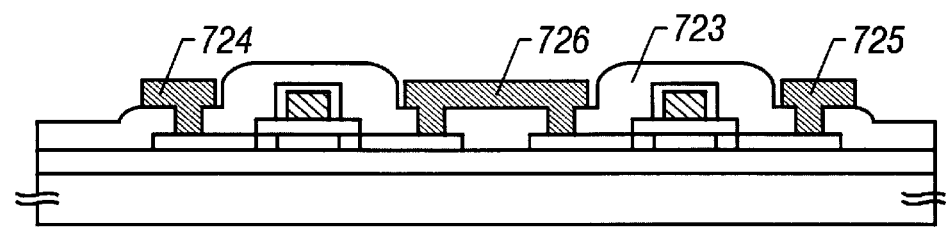

Then, contact holes are formed, and source wiring lines 724 and 725, and a drain wiring line 726 are formed to obtain the state shown in FIG. 7E. Finally, a heat treatment is carried out in a hydrogen atmosphere to hydrogenate the whole so that the CMOS circuit is completed.

The CMOS circuit shown in this embodiment is also called an inverter circuit, and is a basic circuit for constituting a semiconductor circuit. By combining such inverter circuits, it is possible to constitute a basic logic circuit such as a NAND circuit and a NOR circuit, and further to constitute a complicated logic circuit.

In the TFT manufactured in the manner described above, since catalytic elements such as nickel are hardly contained in the channel formation regions 717 and 722, and the contact portions at both ends thereof, such a catalytic element does not have a bad influence to the electric characteristics. Thus, it is possible to constitute a highly reliable TFT, CMOS circuit, and further, semiconductor circuit.

[Embodiment 10]

This embodiment is an example in which gettering of nickel is further strongly carried out in the structure of embodiment 1 or embodiment 2.

In this embodiment, a quartz substrate is used as a substrate. Then a heat treatment is carried out at a stage before the film formation of the insulating film 111 in FIG. 1E or at the stage of FIG. 5F.

The heat treatment is carried out at 950° C. for 30 minutes in an oxygen atmosphere containing a HCl gas of 3 vol %. By this, nickel is transformed into nickel chloride and is vaporized into the atmosphere, so that nickel is removed from the silicon film. A thermal oxidation film with a thickness of about 30 nm is formed.

This thermal oxidation film may be used as a gate insulating film as it is, or may be removed.

In the thus obtained crystalline silicon film, nickel is thoroughly removed, and the crystal structure is made denser at the formation of the thermal oxidation film. When this crystalline silicon film is used, it is possible to obtain a TFT having characteristics comparable to the case where a single crystal is used.

[Embodiment 11]

In this embodiment, an example in which a silicon material is used as a gate electrode, will be described. FIG. 8 schematically shows manufacturing steps.

Figure 8A:
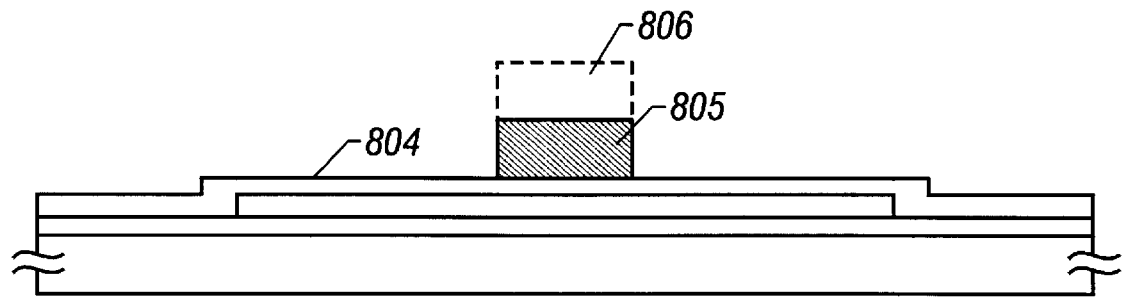
FIGS. 8A, 8B and 8D are views showing manufacturing steps of a thin film transistor.

First, in accordance with the manufacturing steps shown in embodiment 1 or embodiment 2, as shown in FIG. 8A, an under film 802, an active layer 803, and a gate insulating film 804 are formed on a glass substrate (or quartz substrate) 801.

Then a microcrystalline silicon film doped with phosphorus of a high concentration is formed by a low pressure thermal CVD method. Then the film is patterned into a pattern 805 by using a resist mask 806.

The pattern 805 becomes a gate electrode. As a material of the gate electrode, various kinds of metal material and various kinds of silicide material may be used.

Figure 8B:
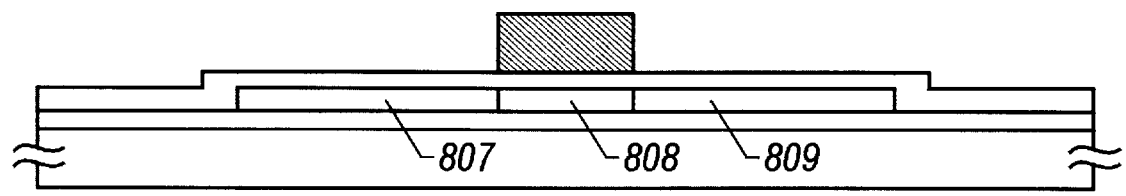
Figure 8C:
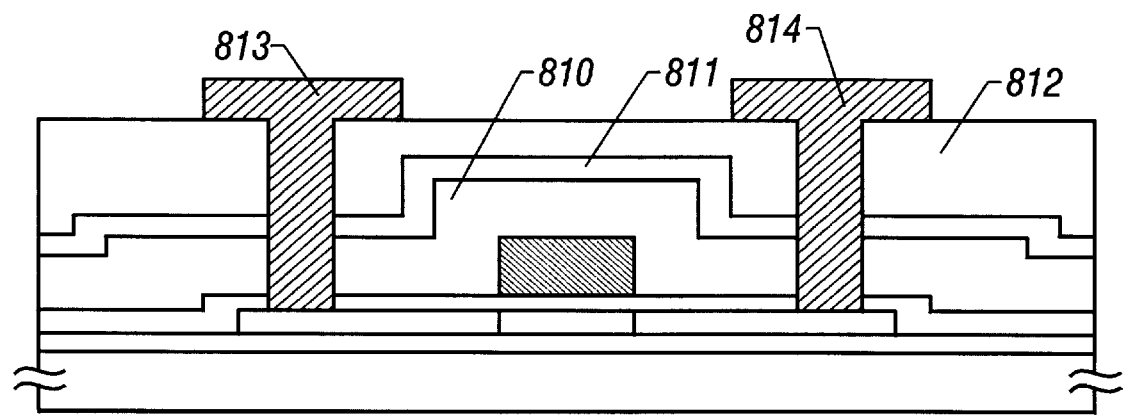

Next, doping of phosphorus is carried out to form a source region 807, a drain region 809, and a channel formation region 808 in a self-aligning manner (FIG. 8B).

Next, a silicon oxide film 810 is formed, and further a silicon nitride film 811 and an acrylic resin film 812 are formed.

Then contact holes are formed, and a source electrode 813 and a drain electrode 814 are formed (FIG. 8D).

[Embodiment 12]

In this embodiment, as an example of applying the present invention to a bottom-gate type TFT, an example in which the present invention is applied to a reverse stagger type TFT, will be described.

Figure 9A:
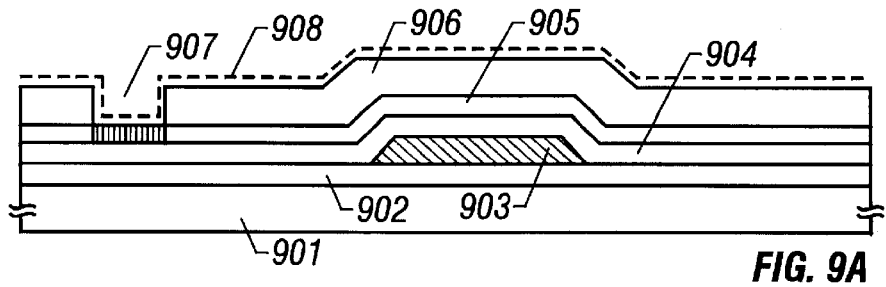
FIGS. 9A to 9F are views showing manufacturing steps of a TFT.

In FIG. 9A, 901 designates a glass substrate, 902 designates an under film, 903 designates a gate electrode made of a conductive material, 904 designates a gate insulating film, 905 designates an amorphous silicon film, and 906 designates an insulating film which becomes a mask in a subsequent step of adding a catalytic element. An opening portion 907 is provided in the mask insulating film 906.

When a subsequent crystallization step or gettering step is carried out by furnace annealing, a heat treatment at 500° to 700° C. is carried out, so that it is necessary to use a material, which can withstand the temperature, as the gate electrode 903. Of course, if laser annealing or lamp annealing is used, the range of selection of usable materials is widened.

Then, by the spin coating method as in embodiment 2, a layer 908 containing a catalytic element (nickel is exemplified also in this embodiment) is formed (FIG. 9A).

Figure 9B:
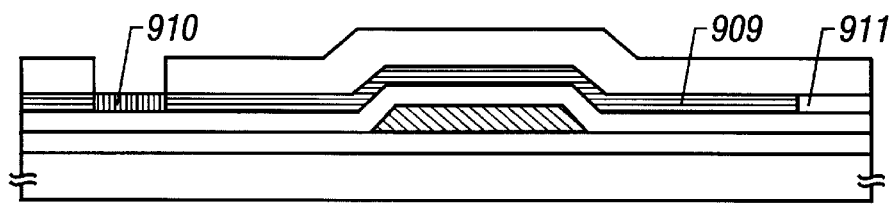

Next, a heat treatment for crystallization is carried out, so that a lateral growth region 909 made of a crystalline silicon film is formed. Incidentally, 910 designates a nickel added region made of a crystalline silicon film, and 911 designates an amorphous region which has not been crystallized (FIG. 9B).

Figure 9C:
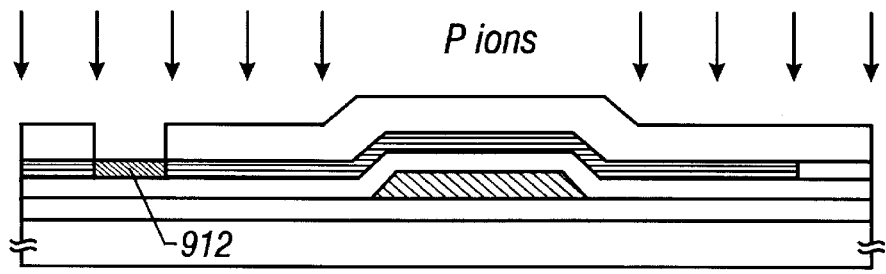

Next, an element (phosphorus is exemplified also in this embodiment) for gettering nickel is added. At this time, a P ion is added into only the nickel added region 910, so that a phosphorus added region 912 is formed (FIG. 9C).

Figure 9D:
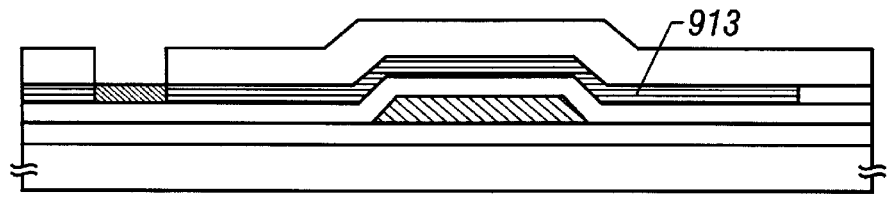

Next, a heat treatment for gettering is carried out to move nickel toward the phosphorus added region 912 to carry out gettering. In this way, a lateral growth region 913 in which nickel is removed or the concentration of nickel is lowered to $5 \times 10^{17}$ atoms/cm$^3$ or less, is formed (FIG. 9D).

Next, the insulating film 906 as a mask is removed, and the lateral growth region 913 is patterned to form an active layer 914. Then a channel stopper 915 formed by patterning a silicon nitride film is provided on the active layer 914 (FIG. 9E).

Figure 9E:
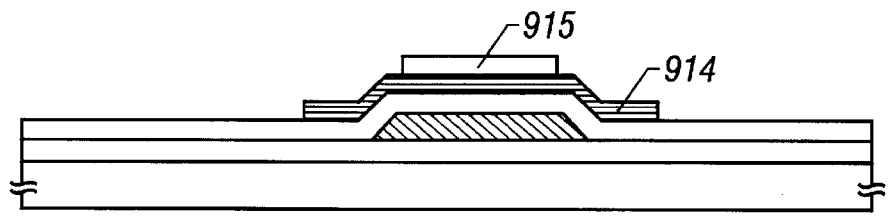
Figure 9F:
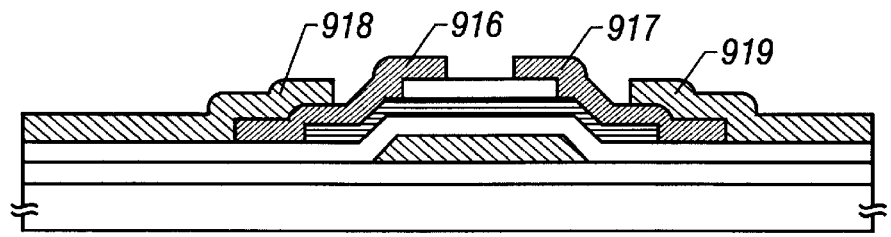

After the state of FIG. 9E is obtained, a crystalline silicon film showing N-type is formed and is patterned to form a source region 916 and a drain region 917. Further, a source wiring line 918 and a drain wiring line 919 are formed. And finally, the whole is hydrogenated to complete the reverse stagger type TFT shown in FIG. 9F.

As described above, the present invention can be applied to any semiconductor device irrespective of the structure as long as the device is an insulated gate type semiconductor device.

[Embodiment 13]

In this embodiment, an example in which an electro-optical device is constituted by using TFTs to which the present invention is applied, will be described. Although an example in which the present invention is applied to an active matrix type liquid crystal display device, will be described, the present invention can also be applied to an active matrix type EL display device, an active matrix type EC display device, and the like.

Figure 10:
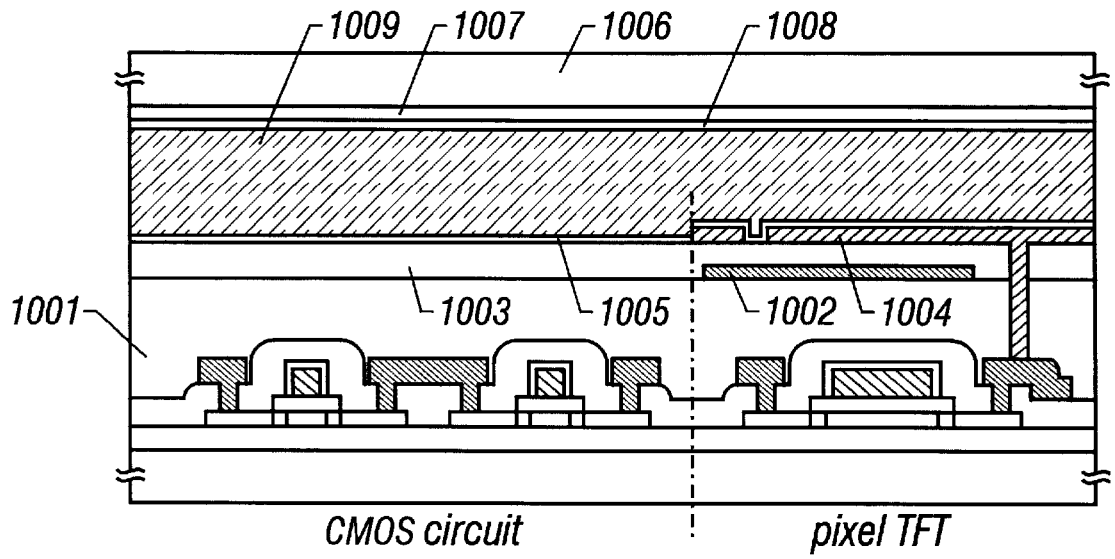
FIG. 10 is a view showing a section of a liquid crystal display device.

FIG. 10 is a view schematically showing a section of an active matrix type liquid crystal display device, and shows a CMOS circuit at a region where a driver circuit and a logic circuit are formed, and a pixel TFT at a region where a pixel matrix circuit is formed.

Since the structure of the CMOS circuit (TFT structure) has been described in embodiment 9, only necessary portions will be described in this embodiment.

In accordance with the manufacturing steps of the CMOS circuit shown in embodiment 9, the CMOS circuit at the left side in FIG. 10 is completed. At this time, the structure of the pixel TFT at the right side is basically the same as the TFT constituting the CMOS circuit. Of course, it is also possible to make only the pixel TFT a multi-gate structure or to change the length of an LDD region. In this case, the modification may be done by an operator according to necessity.

An interlayer insulating film 1001 made of an organic resin film is provided on the CMOS circuit, and a black mask 1002 is disposed thereon. In this embodiment, although the black mask 1002 is disposed above only the pixel matrix circuit, the black mask may be disposed above the CMOS circuit.

An interlayer insulating film 1003 is again disposed on the black mask 1002. A contact hole is provided and a pixel electrode 1004 is disposed. As the pixel electrode 1004, a reflective film such as an aluminum film may be used in the case of a reflection type display device, and a transparent conductive film such as an ITO film may be used in the case of a transmission type display device. An oriented film 1005 is provided at the uppermost layer to constitute an active matrix substrate. The active matrix substrate indicates a substrate at the side where the TFT is arranged.

Reference numeral 1006 designates an opposite substrate, 1007 designates an opposite electrode made of a transparent conductive film, and 1008 designates an oriented film at the opposite side. A liquid crystal layer 1009 is held between the opposite substrate of such a structure and the above described active matrix substrate to constitute the active matrix liquid crystal display device as shown in FIG. 10.

Figure 11:
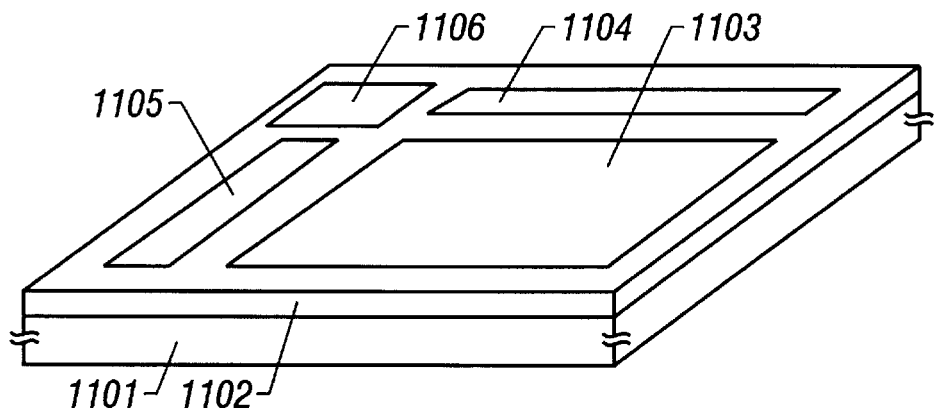
FIG. 11 is a view showing an upper surface of a liquid crystal display device.

FIG. 11 shows a simplified appearance of the active matrix type liquid crystal display device. In FIG. 11, 1101 designates a glass substrate, 1102 designates an under film, 1103 designates a pixel matrix circuit, 1104 designates a source driver circuit, 1105 designates a gate driver circuit, and 1106 designates a logic circuit.

Although the logic circuit 1106 includes all logic circuits constituted by TFTs in a wide sense, in this embodiment, in order to distinguish the logic circuit from a circuit conventionally referred to as a pixel matrix circuit and a driver circuit, the logic circuit indicates a circuit other than the pixel matrix circuit and the driver circuit.

[Embodiment 14]

In this embodiment, as examples of semiconductor devices to which the present invention can be applied, an applied product using an electro-optical device as shown in embodiment 13 will be described with reference to FIGS. 12A to 12F. As the semiconductor devices using the present invention, there are enumerated a video camera, a still camera, a head mount display, a car navigation system, a personal computer, a portable information terminal (mobile computer, portable telephone, etc.), and the like.

Figure 12A:
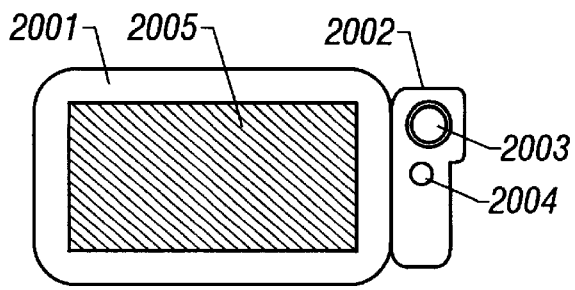
FIGS. 12A to 12F are views showing examples of electronic devices.

FIG. 12A shows a mobile computer which is constituted by a main body 2001, a camera portion 2002, an image receiving portion 2003, an operation switch 2004, and a display device 2005.

Figure 12B:
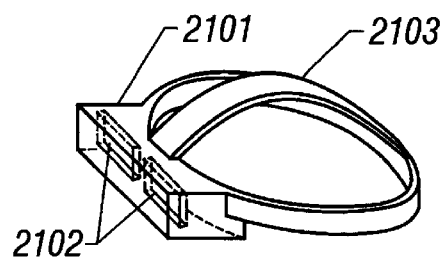

FIG. 12B shows a head mount display which is constituted by a main body 2101, a band portion 2103, and an active matrix type liquid crystal display device 2102. This display is mounted on a head to be used.

Figure 12C:
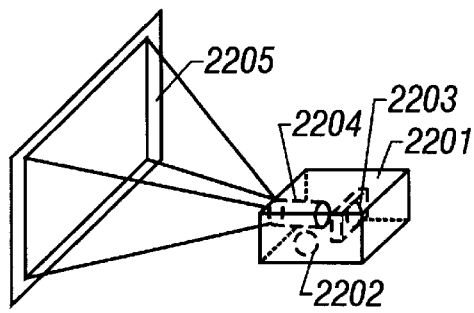

FIG. 12C shows a front type projector which is constituted by a main body 2201, a light source 2202, a display device 2203, an optical system 2204, and a screen 2205.

Figure 12D:
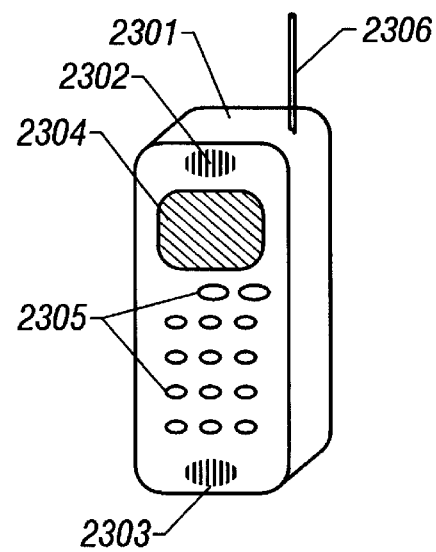

FIG. 12D shows a portable telephone which is constituted by a main body 2301, an audio output portion 2302, an audio input portion 2303, a display device 2304, an operation switch 2305, and an antenna 2306.

Especially, in the case where an active matrix type liquid crystal display device or an active matrix type EL display device is adopted for the display device 2304, the manufacturing steps of the TFT disclosed in the present specification can be used.

Figure 12E:
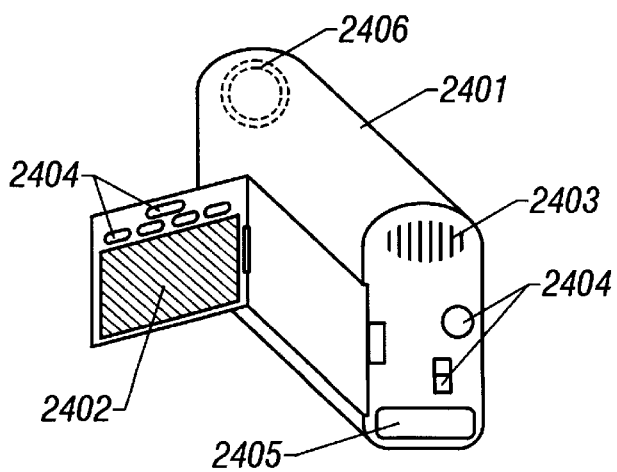

FIG. 12E shows a video camera which is constituted by a main body 2401, a display device 2402, an audio input portion 2403, an operation switch 2404, a battery 2405, and an image receiving portion 2406. The present invention can be applied to the display device 2402.

Figure 12F:
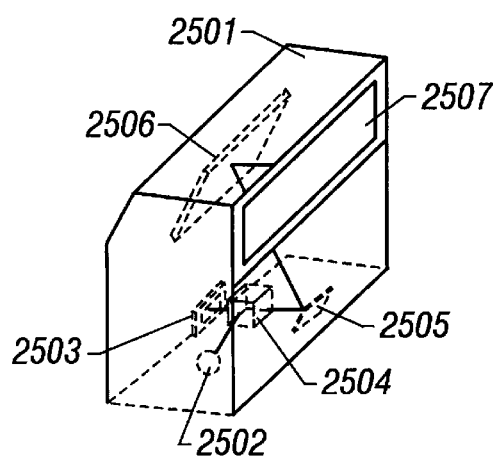

FIG. 12F shows a rear type projector which is constituted by a main body 2501, a light source 2502, a display device 2503, a polarized beam splitter 2504, reflectors 2505 and 2506, and a screen 2507.

As described above, the range of application of the present invention is extremely wide, and the present invention can be applied to a display medium of all fields.

By using the present invention disclosed in the present specification, in the case where a semiconductor device is manufactured by using a crystalline silicon film obtained by using a metal element, it is possible to remove the influence of the metal element used.

Further, by using the present invention, it is possible to effectively remove a catalytic element or lower its concentration in a crystalline film obtained by using the catalytic element for promoting crystallization. Moreover, since this process is carried out at a temperature lower than a heat-resistant temperature of glass, a low temperature process can be followed.

Moreover, since a mask used in an addition step of a catalytic element is also used as a mask for an addition step of an element selected from group 15, the manufacturing process can be greatly simplified. Thus, the throughput and yield are improved, and the present invention is economically advantageous.

Further, in the crystalline film obtained by using the present invention, the crystallinity is extremely superior by the effect of the catalytic element, and the catalytic element is removed or its concentration is lowered by the gettering process. Thus, when the crystalline film is used as an active layer of a semiconductor device, it is possible to obtain a semiconductor device having superior electrical characteristics and high reliability.

What is claimed is:

1. A method of manufacturing a semiconductor device comprising the steps of:

forming a semiconductor film comprising amorphous silicon on an insulating surface of a substrate;

providing a first selected portion of said semiconductor film with a catalyst material for promoting crystallization thereof;

heating said catalyst material and said semiconductor film to crystallize said semiconductor film from said first selected portion horizontally with said insulating surface wherein said catalyst material diffuses into said semiconductor film during the crystallization;

providing a second selected portion of the crystallized semiconductor film with a gettering material;

heating the crystallized semiconductor film and the gettering material so that said catalyst material contained in the crystallized semiconductor film is moved therethrough in a direction parallel with a crystal growth direction in said heating step for the crystallization; and then patterning the crystallized semiconductor film to define an active region of the semiconductor device.

2. A method according to claim 1 wherein said catalyst material comprises a metal selected from the group consisting of Fe, Co, Ni, Ru, Rh, Pd, Os, Ir, Pt, Cu, Au and a combination thereof.

3. A method according to claim 1 wherein said first selected portion is the same portion as said second selected portion.

4. A method according to claim 1 wherein said gettering material is selected from the group consisting of phosphorus, nitrogen, arsenic, antimony, bismuth and a combination thereof.

5. A method of manufacturing a semiconductor device comprising the steps of:

forming a semiconductor film comprising amorphous silicon on an insulating surface of a substrate;

providing a first selected portion of said semiconductor film with a catalyst material for promoting crystallization thereof;

heating said catalyst material and said semiconductor film to crystallize said semiconductor film from said first selected portion horizontally with said insulating surface wherein said catalyst material diffuses into said semiconductor film during the crystallization;

heating the crystallized semiconductor film so that said catalyst material contained in the crystallized semiconductor film is moved therethrough in a direction parallel with a crystal growth direction in said heating step for the crystallization; and then patterning the crystallized semiconductor film to define an active region of the semiconductor device, wherein a carrier flow direction in said active region is selected so as to be in conformity with said direction in which said catalyst material is moved in the second heating step.

6. A method according to claim 5 wherein said catalyst material comprises a metal selected from the group consisting of Fe, Co, Ni, Ru, Rh, Pd, Os, Ir, Pt, Cu, Au and a combination thereof.

7. A method of manufacturing a semiconductor device comprising the steps of:

forming a semiconductor film comprising amorphous silicon on an insulating surface of a substrate;

forming a mask over said semiconductor film to define a selected portion of the semiconductor film;

providing said selected portion of said semiconductor film with a catalyst material by using said mask, said catalyst material having a capability of promoting crystallization said semiconductor film;

heating said catalyst material and said semiconductor film to crystallize said semiconductor film at least partly wherein said catalyst material diffuses into said semiconductor film during the crystallization;

providing said selected portion of the crystallized semiconductor film with a gettering material by using said mask;

heating the crystallized semiconductor film and the gettering material so that said selected portion absorbs said catalyst material contained in the crystallized semiconductor film.

8. A method according to claim 7 wherein said catalyst material comprises a metal selected from the group consisting of Fe, Co, Ni, Ru, Rh, Pd, Os, Ir, Pt, Cu, Au and a combination thereof.

9. A method according to claim 7 wherein said gettering material is selected from the group consisting of phosphorus, nitrogen, arsenic, antimony, bismuth and a combination thereof.

10. A method according to claim 7 wherein said gettering material is provided to said portion by introducing ions of said gettering material thereinto.

11. A method according to claim 7 wherein said gettering material is provided to said portion by forming a film containing said gettering material on said portion.

12. A method according to claim 7 wherein said gettering material is provided to said portion by exposing said portion to a gas containing said gettering material.

13. A method according to claim 7 wherein said gettering material is selected from the group 15 elements of the Periodic Table.

14. A method according to claim 7 wherein the second heating step is conducted at a temperature from 500 to 700° C.

15. A method according to claim 13 wherein said gettering material is introduced into said selected portion at a concentration from $5\times10^{19}$ to $2\times10^{21}$ atoms/cm$^3$.

16. A method of manufacturing a semiconductor device comprising the steps of:

forming a semiconductor film comprising amorphous silicon on an insulating surface of a substrate;

forming a mask over said semiconductor film to define a selected portion of the semiconductor film;

providing said selected portion of said semiconductor film with a catalyst material by using said mask, said catalyst material having a capability of promoting crystallization said semiconductor film;

heating said catalyst material and said semiconductor film to crystallize said semiconductor film at least partly wherein said catalyst material diffuses into said semiconductor film during the crystallization;

introducing phosphorus ions into said selected portion of the crystallized semiconductor film by using said mask;

heating the crystallized semiconductor film and the phosphorus so that said selected portion absorbs said catalyst material contained in the crystallized semiconductor film; and then patterning the crystallized semiconductor film to define an active region, wherein said selected portion is excluded from said active region.

17. A method according to claim 17 wherein said catalyst material comprises a metal selected from the group consisting of Fe, Co, Ni, Ru, Rh, Pd, Os, Ir, Pt, Cu, Au and a combination thereof.

18. A method according to claim 17 wherein the second heating step is conducted at a temperature from 500 to 700° C.

19. A method according to claim 17 wherein said phosphorus is introduced into said selected portion at a concentration from $5\times10^{19}$ to $2\times10^{21}$ atoms/cm$^3$.

20. A method according to claim 1 wherein said semiconductor device is an EL display device.

21. A method according to claim 5 wherein said semiconductor device is an EL display device.

22. A method according to claim 7 wherein said semiconductor device is an EL display device.

23. A method according to claim 17 wherein said semiconductor device is an EL display device.

24. A method according to claim 1 wherein said semiconductor device is one of a mobile computer, head mount display, front type projector, portable telephone, video camera and rear type projector.

25. A method according to claim 5 wherein said semiconductor device is one of a mobile computer, head mount display, front type projector, portable telephone, video camera and rear type projector.

26. A method according to claim 7 wherein said semiconductor device is one of a mobile computer, head mount display, front type projector, portable telephone, video camera and rear type projector.

27. A method according to claim 17 wherein said semiconductor device is one of a mobile computer, head mount display, front type projector, portable telephone, video camera and rear type projector.

* * * * *